United States Patent [19]
Bridgeman

[11] Patent Number: 6,147,475
[45] Date of Patent: Nov. 14, 2000

[54] PREDICTION OF HARMONIC DISTORTION AND APPLICATION OF POWER-FACTOR CORRECTION IN AC POWER SYSTEMS

[75] Inventor: Mark James Bridgeman, Stafford, United Kingdom

[73] Assignee: Alstom UK Ltd., United Kingdom

[21] Appl. No.: 09/288,738

[22] Filed: Apr. 6, 1999

[30] Foreign Application Priority Data

Apr. 9, 1998 [GB] United Kingdom ................... 9807638
Jun. 8, 1998 [GB] United Kingdom ................... 9812130

[51] Int. Cl.[7] ......................................................... G05F 1/70
[52] U.S. Cl. ........................................................... 323/211
[58] Field of Search .................................. 323/205, 208, 323/209, 210, 211

[56] References Cited

U.S. PATENT DOCUMENTS

| | | | |
|---|---|---|---|
| 4,377,833 | 3/1983 | Udren ........................................ | 323/211 |
| 5,227,713 | 7/1993 | Bowler et al. ............................ | 323/210 |
| 5,374,853 | 12/1994 | Larsen et al ............................. | 323/211 |
| 5,402,057 | 3/1995 | D'Aquila et al. ........................ | 323/211 |
| 5,402,058 | 3/1995 | Larsen ...................................... | 323/210 |
| 5,469,045 | 11/1995 | Dove et al. ............................... | 323/210 |
| 5,583,423 | 12/1996 | Bangerter ................................. | 323/211 |
| 5,652,504 | 7/1997 | Bangerter ................................. | 323/211 |
| 5,670,864 | 9/1997 | Marx et al. ............................... | 323/210 |
| 5,736,830 | 4/1998 | Dove et al. ............................... | 323/210 |
| 5,801,459 | 9/1998 | Angquist .................................. | 323/211 |

FOREIGN PATENT DOCUMENTS

| | | | |
|---|---|---|---|
| 0 168 147 A1 | 1/1986 | European Pat. Off. ........... | H02J 3/18 |
| 0 431 967 A2 | 6/1991 | European Pat. Off. ........... | H02J 3/18 |
| 0 476 618 A2 | 3/1992 | European Pat. Off. ........... | H02J 3/18 |
| WO 96/37813 | 11/1996 | WIPO .............................. | G05F 1/70 |

*Primary Examiner*—Jeffrey Sterrett
*Attorney, Agent, or Firm*—Kirschstein et al.

[57] ABSTRACT

In a method for predicting harmonic-distortion values for the application of a desired step change of capacitance to an AC system, an initial step change is applied and, from this change, a value of harmonic impedance of the system for each of a number of harmonics is determined. From these harmonic-impedance values corresponding values of damping resistance are, in turn, determined and, using the determined harmonic-impedance and damping-resistance values, corresponding values of an electrical load parameter, preferably load voltage, are determined for the desired step capacitance change. The method is conveniently extended to cover a method and apparatus for applying power-factor correction capacitance, in which the load-voltage values for the various harmonics are evaluated to see if they represent a potential resonance condition and, if so, a step change other than the desired change is applied. Where no resonance is indicated, the originally intended step change is applied.

25 Claims, 2 Drawing Sheets

PREDICTION OF HARMONIC DISTORTION AND APPLICATION OF POWER-FACTOR CORRECTION IN AC POWER SYSTEMS

BACKGROUND OF THE INVENTION

The invention relates to a method for predicting values of harmonic distortion in an AC power system and a method for applying power-factor correction in such a system.

In many AC power systems, usually 3-phase, the loading placed on such systems is very often highly inductive in nature, typically resulting from the operation of heavy electrical machines having a pronounced lagging power factor. In such a situation it is known to attempt to correct for this by the imposition of a known value of capacitance across the AC busbars. However, while it may be an easy matter to apply an appropriate value of capacitance to the system under static loading conditions, in practice AC systems tend to have very unpredictable loading, such that a value of capacitance which may be correct at any one time may be entirely incorrect at a later time.

To cater for such changing conditions, banks of parallel-connected capacitors are often provided, the number of banks which are applied to the system being selected in response to the changing loading conditions. It is a known problem, however, that under certain conditions of capacitance loading a resonance state can be set up between the applied capacitance and the inductance of the power system. Such resonances can have the effect of greatly magnifying the existing harmonic content of the supply voltage and current, thereby causing considerable corruption to the supply waveform. In order to avoid this, it is a commonly used technique to install either harmonic-filtration or harmonic-blocking reactors to the system.

The main problem with these methods is that the installation of the reactive power compensation will typically double in price compared to the use of a simple capacitor bank and will also give rise to a very lossy system, both of which drawbacks weaken the argument for installing such equipment.

SUMMARY OF THE INVENTION

In accordance with a first aspect of the invention, there is provided a method for predicting values of harmonic distortion in a power-factor compensated AC power system defined by, for each of one or more harmonics, a harmonic impedance and a damping resistance, the method comprising the steps of:

(1) imposing a first step change of capacitance on the system, (2) determining as a result of the step change, values of the harmonic impedance for respective said harmonics;

(3) determining from the harmonic-impedance values, values of the damping resistance for respective said harmonics; and (4) determining from corresponding said harmonic-impedance and damping-resistance values, values of an electrical load parameter for respective said harmonics for a second, as yet unimposed, step change of capacitance.

The electrical load parameter may conveniently be the load voltage and step (1) may comprise the steps of:

(a) measuring the load voltage and system current for each of the harmonics before the first step change;

(b) imposing the first step change; and (c) measuring the load voltage and system current for each of the harmonics after the first step change.

The harmonic impedance may be determined as a ratio of the change in load voltage to the change in system current, these changes being derived from steps (a) and (c).

The damping-resistance value is preferably determined from a transfer function of the system relating a load voltage at each of the harmonics to a system voltage at the same harmonic. This transfer function may be defined as:

$$H=1/\{(1+Rs/Rd-Xls/Xc)+j(Rs/Xc+Xls/Rd)\}$$

where Rs and Xls are the respective real and imaginary components of the harmonic impedance, Xc is a value of capacitance imposed on the AC system and Rd is the damping resistance, the parameters Rs, Xls and Rd all relating to the same harmonic.

The damping-resistance value may be determined from a combination of the transfer function as corresponding to a first value of imposed capacitance and the transfer function as corresponding to a second value of imposed capacitance. This combination may be defined as the ratio of the moduli of the two transfer functions associated with the first and second capacitance values.

The difference between the first and second capacitance values may constitute the first step change and the ratio may be a ratio of the modulus of the transfer function corresponding to the second capacitance value to the modulus of the transfer function corresponding to the first capacitance value.

The damping resistance may be determined from a quadratic equation having the form:

$$aKd^2+bKd+c=0$$

where $Kd=1/Rd$, and $$a=(Rs^2+Xls^2).(Kv^2-1)$$

$$b=2Rs(Kv^2-1)$$

$$c=[\{(Xc_2-Xls)^2+Rs^2\}Kv^2/Xc_2^2]-[\{(Xc_1-Xls)^2+Rs^2\}/Xc_1^2]$$

$Xc_1$ and $Xc_2$ being the reactance of the first and second capacitance values, respectively, and Kv being the ratio of the modulus of load voltage corresponding to the second capacitance value to the modulus of load voltage corresponding to the first capacitance value.

When load conditions change, so too generally should the value of capacitive applied power-factor correction. Under these circumstances an updated value of required correction is determined, i.e., a third value of capacitance, and step (4) then comprises the steps of:

(a) forming a transfer-function ratio:

$$|H_3|/|H'|=\{[(1+Rs/Rd-Xls/Xc')^2+(Rs/Xc'+Xls/Rd)^2]/[(1+Rs/Rd-Xls/Xc_3)^2+(Rs/Xc_3+Xls/Rd)^2]\}^{1/2}$$

where $Xc_3$ relates to the third capacitance value and H' and Xc' relate to a previous capacitance value imposed on the system, and (b) multiplying a value of an electrical load parameter relating to the previous capacitance value by the result of the ratio formation, thereby to arrive at a value of an electrical load parameter relating to the third capacitance value.

The previous capacitance value may be one of the first and second capacitance values.

In accordance with a second aspect of the invention, a method for applying power-factor-correction capacitance to an AC power system comprises a method for predicting harmonic distortion values, the second step capacitance change being a desired change for the purposes of power-factor correction, and the additional steps of:

(5) determining from the electrical load parameter values obtained in step (4) whether the imposition of the second step capacitance change would result in an undesirable resonance condition for the system, and where it is determined that a resonance condition would result, (6) imposing a step capacitance change other than second step change, thereby to avoid the resonance condition.

The sequence of at least steps (1), (3) and (4) will normally be performed on a repetitive basis, either whenever a change in load calls for a change in the capacitance imposed on the system, or on a completely periodic, regular basis, or a combination of the two.

Advantageously, the second step change in any one sequence may become the first step change in a succeeding sequence.

The invention further includes a power factor controller for correcting lagging power factor in an AC power supply system operating at a variable power factor, comprising:

measurement means for periodically measuring electrical load parameter values of the power supply system, switching means for individually controlling connection of each of a plurality of capacitances to the power supply system, digital signal processor means connected to the measurement means and the switching means for calculating the power factor of the power supply system from the electrical load parameter values and deciding whether correction of lagging power factor is required and, if correction is required, deciding in accordance with the method described above which of the power factor correction capacitances should be applied to the power supply system by the switching means to correct the power factor.

BRIEF DESCRIPTION OF THE DRAWINGS

Exemplary embodiments of the invention will now be described with reference to the drawings, in which.

DETAILED DESCRIPTION OF THE PREFERRED EMBODIMENT

Figure 1:
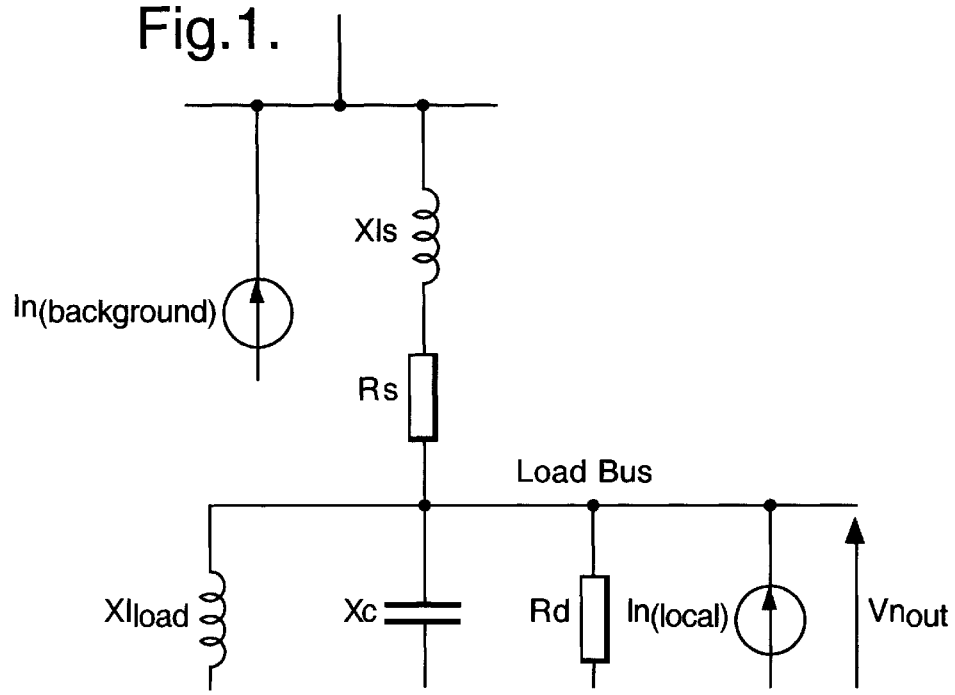
FIG. 1 shows a simple model of an AC system having both local and background sources of harmonic distortion.

Referring first to FIG. 1, this figure shows a typical model for a power system that includes both local and background sources of harmonic distortion. Rs and Xls represent the harmonic impedance of the system, Xc the reactive power compensation connected to the busbar, $Xl_{(load)}$ the reactive component of the load connected to the busbar and Rd the active component of that load. $In_{(local)}$ and $In_{(background)}$ represent local and background sources of harmonic distortion, respectively. $Vn_{(out)}$ represents the level of harmonic voltage distortion imposed upon the load busbar, this being the quantity that most users will wish to keep to a minimum.

The quantity Rd of the system is very important, for it is this that provides most of the harmonic damping in the system that will limit the magnitude of any potentially resonant harmonics.

Figure 2:
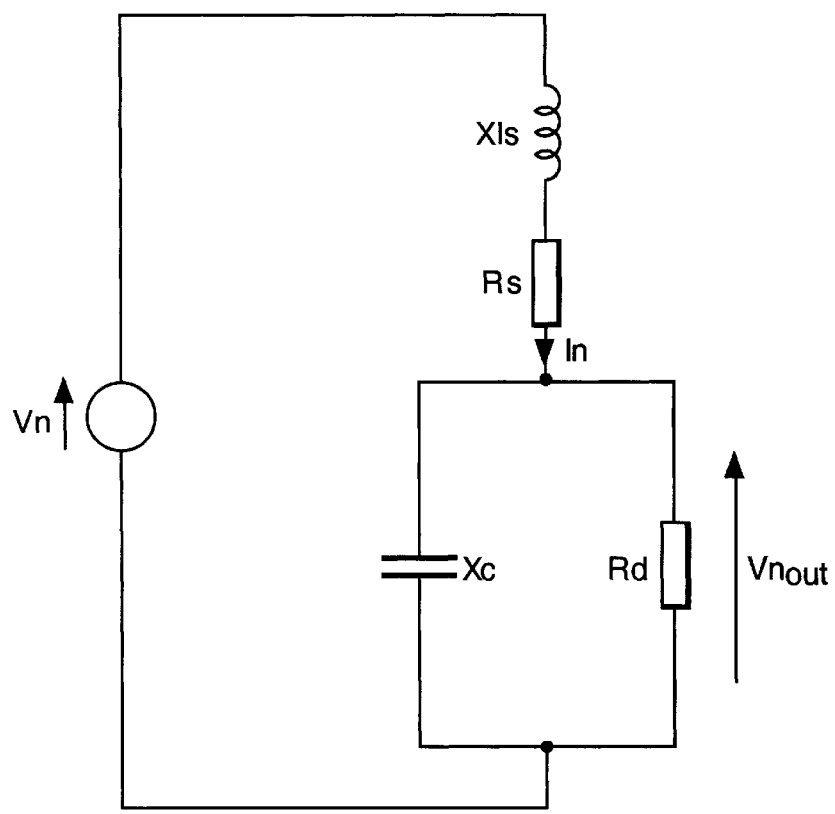
FIG. 2 is the model of FIG. 1 further simplified.

The model shown in FIG. 1 can, in most practical systems, be simplified by the exclusion of the quantity $Xl_{(load)}$ without significantly affecting the accuracy of the results of the calculations hereinafter outlined. Such a simplification is illustrated in FIG. 2, in which the harmonic-impedance components Rs and Xls, applied capacitance Xc and load (damping) resistance Rd are as before, and in which Vn represents the system distortion voltage source and $Vn_{(out)}$ the distortion voltage as seen on the load busbars.

The first step in the method according to the invention for predicting values of harmonic distortion is to establish reasonably accurate values of the harmonic-impedance components Rs, Xls for each of a number of harmonics of interest. In the past, statistical methods of harmonic analysis have been employed, but these rely on the measurement of harmonic quantities over a long period of time. The present application requires measurement of harmonic impedance to be carried out over relatively short periods of time.

A known way of achieving relatively quick calculation of harmonic impedance is to monitor changes in harmonic voltage and current, i.e., $$Zn=\Delta Vn_{out}/\Delta In \qquad (1)$$

where $$Zn=Rs+Xls \qquad (2)$$

and $Vn_{out}$, In are as shown in FIG. 2. Zn is the value of harmonic impedance for harmonic n (e.g., n=3 for the 3rd harmonic).

The changes that are conventionally used are those resulting from natural fluctuations in voltage and current which occur mainly due to load changes. A problem with this approach is that, as the supply impedance of the system can be adequately represented as being inductive, any change in real-power transfer across this inductance must be as a result of a change in phase difference between the sending- and receiving-end voltages. As the sending-end voltage source can be considered to be an infinite bus, the change in phase angle difference will be mainly due to a change in the phase of the receiving-end voltage. This change of phase, although small for the fundamental frequency, is multiplied for each of the harmonics and consequently the measurement of harmonic impedance becomes difficult and subject to errors.

In the present invention the required voltage and current changes are produced not by a change in load, but by a change in the capacitance which is imposed on the system. Since in this case the power-transfer change is reactive, the resulting change in the receiving-end voltage will be predominantly a change in magnitude, the phase information changing only marginally. This preservation of phase information means that harmonic impedance measurements carried out using capacitor switching as a stimulus are less prone to phase errors.

The harmonic impedance according to the present invention, then, is calculated as:

$$Zn=(Vn_{out2}-Vn_{out1})/(In_2-In_1) \qquad (3)$$

where $Vn_{out2}$, correspond to a value of capacitance $C_2$ and $Vn_{out1}$, to a value of capacitance $C_1$ across the AC system.

The harmonic impedance having been derived for those harmonics which are of interest, the next step is to derive for those same harmonics a value for the damping resistance, effectively Rd. To do this it is necessary to form a transfer function for the system, namely the ratio of $Vn_{out}$ to Vn. Inspection of FIG. 2 will reveal this ratio to be:

$$H=Vn_{out}/Vn=1/\{(1+Rs/Rd-Xls/Xc)+j(Rs/Xc+Xls/Rd)\} \qquad (4)$$

If we now form a ratio of this transfer function for two different values of capacitive reactance $Xc_1$, $Xc_2$ associated with the above two different values of capacitance $C_1$, $C_2$ imposed on the AC system, then we have:

$$H_2/H_1 = [(1+Rs/Rd-Xls/Xc_1)+(Rs/Xc_1+Xls/Rd)]/[(1+Rs/Rd-Xls/Xc_2)+(Rs/Xc_2+Xls/Rd)] \quad (5)$$

and taking the moduli of the two transfer functions, we have:

$$|H_2/H_1| = \{[(1+Rs/Rd-Xls/Xc_1)^2+(Rs/Xc_1+Xls/Rd)^2]/[(1+Rs/Rd-Xls/Xc2)^2+(Rs/Xc2+Xls/Rd)^2]\}^{1/2} \quad (6)$$

where $$|H_2/H_1| = Vn_{out2}/Vn_{out1} \quad (7)$$

these voltage values again being associated with second and first values, respectively, of imposed capacitance. Such a ratio is formed for each of the harmonics n of interest.

A quadratic equation can be derived from equation (6) which, putting $Kd=1/Rd$ and $Kv=Vn_{out2}/Vn_{out1}$, takes the form of:

$$AKd^2+bKd+c=0 \quad (8)$$

where $$a=(Rs^2+Xls^2).(Kv^2-1)$$

$$b=2Rs(Kv^2-1)$$

$$c=[\{(Xc_2-Xls)^2+Rs^2\}Kv^2/Xc_2^2]-[\{(Xc_1-Xls)^2+Rs^2\}/Xc_1^2] \quad (9)$$

$Xc_1$ and $Xc_2$ being the reactances at the relevant harmonic of the respective capacitances on the AC system before and after the first step capacitance change.

Since $Vn_{out1}$ and $Vn_{out2}$ are measured and therefore known, and Rs, Xls, $Xc_1$ and $Xc_2$ are also known for the relevant harmonics, Kd is readily found as the solution of this quadratic for those harmonics.

Having now thus obtained a value of Rd for each harmonic, a value can be derived for the change in distortion for each of these harmonics which would result from the application of a further capacitance step, e.g., a step change from capacitance $C_2$ to $C_3$. This is achieved by re-evaluating equation (6) for the present value of Xc, namely $Xc_2$, and a new value $Xc_3$, i.e.:

$$|H_3/H_2| = \{[(1+Rs/Rd-Xls/Xc_2)^2+(Rs/Xc_2+Xls/Rd)^2]/[(1+Rs/Rd-Xls/Xc_3)^2+(Rs/Xc_3+Xls/Rd)^2]\}^{1/2} \quad (10)$$

The values of Rs and Xls remain as before and Rd is the value of damping resistance just calculated.

The ratio hereby obtained gives us the factor of change relating the harmonic distortion associated with the presently applied capacitance ($C_2$) to that associated with the capacitance ($C_3$) which is proposed to be applied. If now the values of harmonic distortion corresponding to $C_2$ for the various harmonics of interest are multiplied by the respective results of equation (10) for the respective harmonics, then the absolute values of distortion for each of those harmonics can be calculated for the proposed value of capacitance, $C_3$.

Having obtained projected values for the harmonic distortion associated with $C_3$, these are evaluated to see if any of them might represent a resonance condition, in which case the step change to $C_3$ is not applied, but another step change, which may be to a new capacitance $C_4$, may be applied or the present value $C_2$ may be maintained. On the other hand, where no resonance condition is detected, capacitance $C_3$ will be imposed on the system.

It should be noted that it may be found to be convenient to measure the above-mentioned voltage and current values for the case of, firstly, no applied capacitance across the system ($Xc_1=\infty$) and, secondly, one applied incremental step of capacitance across the system ($Xc_2$=finite). This would have the advantage of simplifying at least the initial calculations.

The above-described procedure is repeated each time a change in loading is detected and a new value of capacitance is required to be applied. Thus, assuming the presently applied capacitance value to be $C_3$, where the system loading changes such as to require a fresh value $C_4$, the harmonic impedance is recalculated to reflect the change in In and Vnout that occurs when the capacitance $C_2$ is changed to $C_3$. These voltage and current values have already been measured for $C_2$, but not for $C_3$. Either it can be arranged for the old values corresponding to $C_2$ to be used and values corresponding to $C_3$ to be measured directly after $C_3$ has been applied, or completely fresh values can be measured corresponding to both $C_2$ and $C_3$ when the change in loading occurs and calls for the new capacitance ($C_4$). The advantage of the latter approach is that it gives rise to completely up-to-date values of In and Vnout which will result in more accurate values of distortion associated with capacitance $C_4$, bearing in mind the changed load conditions. To re-measure voltage and current for the application of $C_2$ and $C_3$, the capacitor bank(s) corresponding to the difference between $C_3$ and $C_2$ is (are) momentarily removed to leave value $C_2$ across the system, then the same capacitor bank(s) is (are) reconnected, the appropriate voltage and current being measured for both events.

Having produced fresh measurements of load voltage and system current, the harmonic impedance for the various harmonics is recalculated using equation (3) and Rd is recalculated using equations (8) and (9) and the values of harmonic impedance just calculated. Finally, equation (10) is employed to derive the change in harmonic distortion which will result from the change in capacitance from $C_3$ to $C_4$ and the distortion figures for $C_3$ are then multiplied by the change factor obtained from equation (10) to arrive at the absolute distortion figures for $C_4$. Once more, these absolute figures are evaluated to check for possible resonance states and, where a possible resonance in any of the harmonics of interest is spotted, either capacitance value $C_3$ is maintained or a new step $C_5$ is imposed. Where no resonance is likely to occur, capacitance $C_4$ is imposed on the system.

This procedure is carried out each time the loading on the system changes, though it may be arranged to occur on a more regular cyclical basis even where load changes have not been sensed. Sensing of load changes is by any convenient known method, e.g., using voltage and current transformers and associated measuring equipment including current, voltage and phase meters.

Evaluation of the absolute harmonic-distortion figures derived from equation (10) involves comparison of these figures with pre-determined threshold figures, the latter being defined as undesirable "resonance" levels derived mainly empirically from experience with real AC power systems. Such comparison can be carried out in software, the results of such comparison then determining, as described above, whether or not the proposed value of capacitance is imposed on the system. Alternatively, comparison could be effected in hardware using comparators.

It should be noted that, where capacitance changes occur over a relatively short time scale, it may not be necessary to recalculate each time the harmonic impedance of the AC system; rather, the same values of harmonic impedance may be used in the recalculation of the damping resistance Rd (1/Kd) over that period. Eventually, however, it will be necessary to recalculate the harmonic impedance. At all events, the rate of recalculation of this parameter will be determined on an empirical basis for the particular installation in question.

Although it will normally be found to be convenient to recalculate the harmonic impedance and the damping resistance on the basis of voltage and current measurements associated with neighboring values of capacitance, e.g., $C_2$ to $C_3$ or $C_3$ to $C_4$, where these are both one incremental step, in practice larger increments may be used, e.g., from $C_2$ to $C_4$, or $C_1$ to $C_3$ (or even $C_1$ to $C_4$), etc. The same applies in the case of the derivation of the change in distortion arising from the proposed application of a new capacitance (e.g., $C_3$) using equation (10); here, instead of using assumed neighboring reactance values (one incremental step) $Xc_2$ and $Xc_3$, $Xc_1$ and $Xc_3$ (two incremental steps) may be used, (or, e.g., $Xc_1$ and $Xc_4$ in the case of a proposed capacitance $C_4$).

Figure 3:
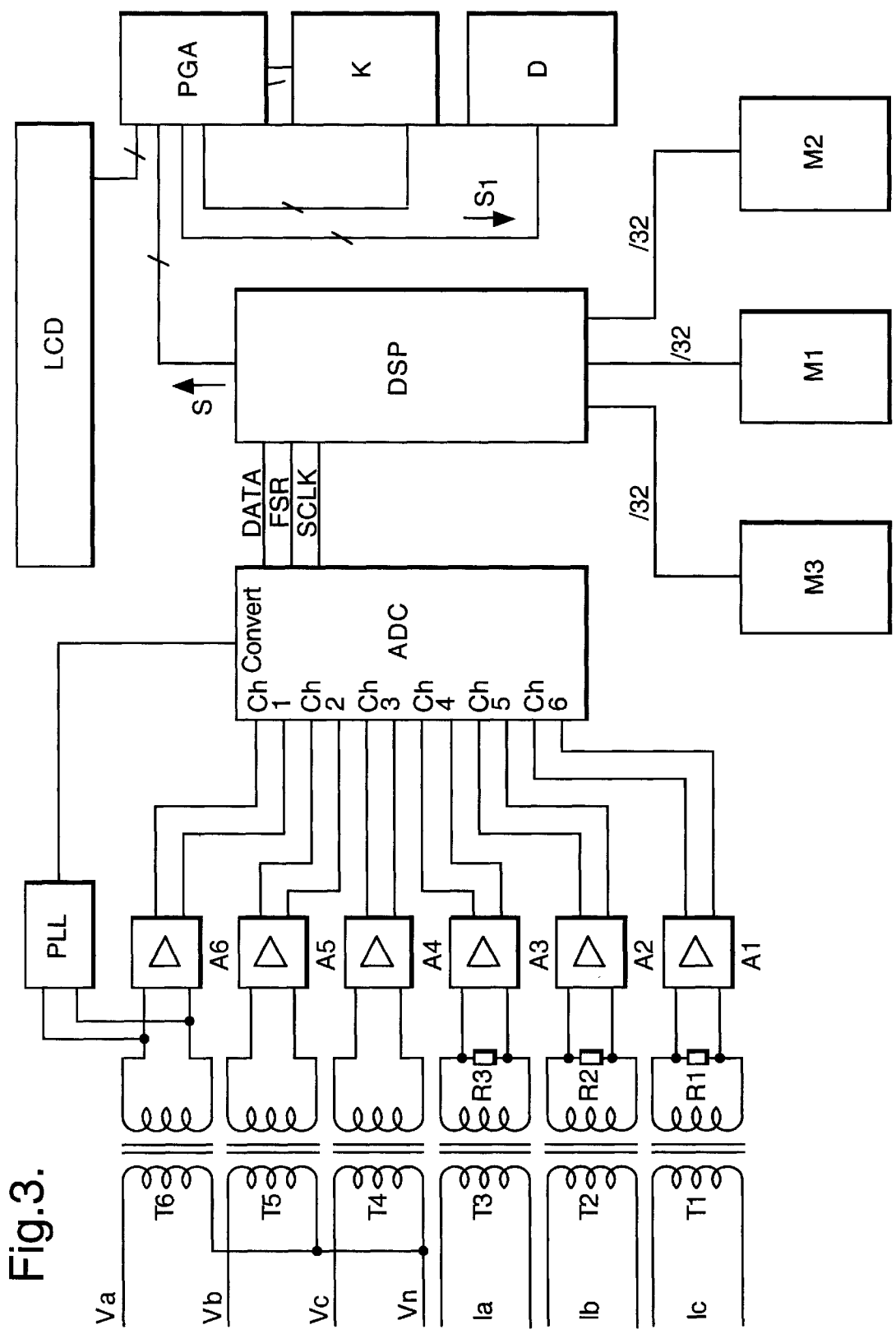
FIG. 3 is a schematic diagram of a power factor controller according to the invention.

FIG. 3 shows schematically a microprocessor-based implementation of a power factor controller required to accurately measure power factor in a three-phase AC power supply system and then, if it is necessary to correct for inductive power, switch in banks of parallel-connected capacitors to correct the power factor.

The equipment shown is based on well-known 32-bit microprocessor architecture and therefore it will only be described in outline. Electrical load parameter values of the power supply system, in the form of three input line currents Ia, Ib, Ic, and three input voltages Va, Vb, Vc from the three phases being monitored, are continuously sampled by a six-channel analogue-to-digital converter ADC, the voltages Va, Vb, Vc being referred to the neutral voltage Vn. Sampling is performed by linking the voltage and current inputs to the ADC through respective instrumentation amplifiers A1 to A6 and signal transformers T1 to T6, the current signals Ia, Ib, Ic being converted to voltage signals by connecting the instrument amplifiers A1 to A6 across resistors R1 to R3 on the output taps of the transformers T1 to T3. Amplifiers A1 to A6 act as signal conditioning buffers, converting the voltage signals received from the transformers into differential voltage signals for the ADC.

The apparatus in FIG. 3 enables simultaneous synchronous sampling of the six channels. Synchronization is achieved by connecting the "convert" input of the ADC to the output of a phase locked loop PLL connected across one of the transformers T6. This enables sampling at the rate of 256 samples per cycle of the phase voltage Va to which the transformer T6 is connected. The ADC therefore acts as a sample-and-hold device synchronized with the three phase AC power supply.

The ADC is interrogated for the sample data on a data link DATA by a TMS320C32-40 digital signal processor DSP, this being a well-known microprocessor device. Data interrogation is timed by means of a serial clock link SCLK between the ADC and the DSP, the other link between the two devices being the frame sync receive link FSR, which signals the start and stop of each data signal from the ADC.

Three memory blocks are linked to the DSP to enable it to perform its functions of: calculating the power factor of the power supply system from the electrical load parameter values, deciding whether correction of lagging power factor is required, and if correction is required, deciding in accordance with the method previously described what power factor correction capacitances should be applied to the power supply system to correct the power factor.

Hence, memory block M1 comprises a 256K flash memory which permanently stores the program code, including the algorithms described above for determining what value of capacitance should be connected to the AC power supply system to achieve an acceptable power factor, while avoiding excessive harmonic distortion. Memory block M2 comprises a 256K RAM for temporary storage of run-time variables, etc. while the DSP is working, while memory block M3 comprises an 8K EEPROM which stores calibration coefficients and other settings which may be varied from time to time but require storage during periods when the DSP is not working.

The DSP outputs various logic signals S, including switching logic signals and measurements from the ADC, to a programmable gate array PGA, which is also used to input setting logic signals to the DSP. The PGA performs the logical functions which enable the DSP and a human operator to interface with peripheral devices. The most important peripheral device with respect to the present invention is the relay driver D, which receives switching signals S1 from the PGA whenever the PGA receives the switching signals S from the DSP. The relay driver D controls a bank of six relays. These in turn select which capacitors from a bank of six are connected to the AC power system to correct a lagging power factor sensed by the DSP. The capacitors may all have the same value of capacitance, or they may differ from each other, and any combination of the capacitors may be connected to the power system at any one time in order to make up a desired amount of reactive load.

Other peripherals connected to the PGA comprise a keypad K and a liquid crystal display LCD which interacts with the keypad. They are used in conjunction with each other to enable an operator to change settings in the DSP and to scroll through other data transmitted from the DSP, such as the phase measurements from instrument amplifiers A1 to A6.

I claim:

1. Method of predicting values of harmonic distortion in a power-factor compensated AC power system defined by, for each of one or more harmonics, a harmonic impedance and a damping resistance, the method comprising the steps of:

(1) imposing a first step change of capacitance on said system, (2) determining as a result of said first step change, values of said harmonic impedance for respective said harmonics;

(3) determining from said harmonic-impedance values, values of said damping resistance for respective said harmonics; and (4) determining from corresponding said harmonic-impedance and damping-resistance values, values of an electrical load parameter for respective said harmonics for a second, as yet unimposed, step change of capacitance.

2. Method as claimed in claim 1, wherein said step (1) comprises (a) measuring the load voltage and system current for each of said harmonics before said first step change;

(b) imposing said first step change; and (c) measuring the load voltage and system current for each of said harmonics after said first step change.

3. Method as claimed in claim 2, wherein said harmonic impedance is determined as a ratio of a change in load voltage to a change in system current, said voltage and current changes being derived from steps (1)(a) and (c).

4. Method as claimed in claim 3, wherein said damping-resistance value is determined from a transfer function of said system relating a load voltage at each of said harmonics to a system voltage at the same harmonic.

5. Method as claimed in claim 4, wherein said transfer function is defined as:

$$H=1/\{(1+Rs/Rd-Xls/Xc)+j(Rs/Xc+Xls/Rd)\}$$

where Rs and Xls are the respective real and imaginary components of said harmonic impedance, Xc is a value of capacitance imposed on the AC system and Rd is said damping resistance, the parameters Rs, Xls and Rd all relating to the same harmonic.

6. Method as claimed in claim 5, wherein said damping-resistance value is determined from a combination of said transfer function as corresponding to a first value of imposed capacitance and said transfer function as corresponding to a second value of imposed capacitance.

7. Method as claimed in claim 6, wherein said combination is defined as the ratio of the moduli of the two transfer functions associated with the first and second capacitance values.

8. Method as claimed in claim 7, wherein the difference between said first and second capacitance values constitutes said first step change and said ratio is a ratio of the modulus of the transfer function corresponding to the second capacitance value to the modulus of the transfer function corresponding to the first capacitance value.

9. Method as claimed in claim 8, wherein said damping resistance is determined from a quadratic equation having the form:

$$AKd^2+bKd+c=0$$

where $Kd=1/Rd$ and $$a=(Rs^2+Xls^2) \cdot (Kv^2-1)$$

$$b=2Rs(Kv^2-1)$$

$$c=[\{(Xc_2-Xls)^2+Rs^2\}Kv^2/Xc_2^2]-[\{(Xc_1-Xls)^2+{}_{Rs2}\}/Xc_1^2]$$

$Xc_1$ and $Xc_2$ being the reactance of the first and second capacitance values, respectively, and Kv being the ratio of the modulus of load voltage corresponding to the second capacitance value to the modulus of load voltage corresponding to the first capacitance value.

10. Method as claimed in claim 9, comprising the determination of a third value of capacitance, intended to be imposed on said system, and wherein said step (4) comprises the steps of:

(a) forming a transfer-function ratio:

$$|H_3/H'|=\{[(1+Rs/Rd-Xls/Xc')^2+(Rs/Xc'+Xls/Rd)^2]/[(1+Rs/Rd-Xls/Xc_3)^2+(Rs/Xc_3+Xls/Rd)^2]\}^{1/2}$$

where $Xc_3$ relates to said third capacitance value and H and Xc relate to a previous capacitance value imposed on said system; and (b) multiplying a value of an electrical load parameter relating to said previous capacitance value by the result of said ratio formation, thereby to arrive at a value of an electrical load parameter relating to said third capacitance value.

11. Method as claimed in claim 10, wherein said previous capacitance value is one of the first and second capacitance values.

12. Method as claimed in claim 1, wherein said electrical load parameter is the load voltage.

13. Method as claimed in claim 1, wherein the sequence of at least steps (1), (3) and (4) is performed on a repetitive basis.

14. Method as claimed in claim 13, wherein said sequence is performed whenever a change in load calls for a change in the capacitance imposed on said system.

15. Method as claimed in claim 13, wherein said sequence is performed with periodic regularity.

16. Method as claimed in claim 13, wherein the second step change in any one sequence becomes the first step change in a succeeding sequence.

17. Method as claimed in claim 1, further comprising the step of determining from said electrical load parameter values whether imposition of said second step change of capacitance would result in an acceptable resonance condition for the system, and the step of imposing said second step change of capacitance only upon the determination that an acceptable resonance condition would result.

18. Method of applying power-factor-correction capacitance to an AC power system, including predicting values of harmonic distortion defined by, for each of one or more harmonics, a harmonic impedance and a damping resistance, the method comprising the steps of:

(1) imposing a first step change of capacitance on said system;

(2) determining as a result of said first step change, values of said harmonic impedance for respective said harmonics;

(3) determining from said harmonic-impedance values, values of said damping resistance for respective said harmonics;

(4) determining from corresponding said harmonic-impedance and damping-resistance values, values of an electrical load parameter for respective said harmonics for a second, as yet unimposed, step change of capacitance, wherein said second step capacitance change is a desired change for the purposes of power-factor correction;

(5) determining from said electrical load parameter values obtained in step (4) whether the imposition of said second step capacitance change would result in an undesirable resonance condition for the system; and, where it is determined that a resonance condition would result, (6) imposing a step capacitance change other than said second step change, thereby to avoid said resonance condition.

19. Method as claimed in claim 18, wherein the sequence of at least steps (1), (3) and (4) is performed on a repetitive basis.

20. Method as claimed in claim 19, wherein said sequence is performed whenever a change in load calls for a change in the capacitance imposed on said system.

21. Method as claimed in claim 19, wherein said sequence is performed with periodic regularity.

22. Method as claimed in claim 19, wherein the second step change in any one sequence becomes the first step change in a succeeding sequence.

23. Method as claimed in claim 18, wherein said electrical load parameter is the load voltage.

24. A power factor controller for correcting lagging power factor in an AC power supply system operating at a variable power factor, the controller comprising:

measurement means for periodically measuring electrical load parameter values of the power supply system, switching means for individually controlling connection of each of a plurality of capacitances to the power supply system, digital signal processor means connected to the measurement means and the switching means for calculating the power factor of the power supply system from the electrical load parameter values and deciding whether correction of lagging power factor is required and, if correction is required, deciding which power factor correction capacitances should be applied to the power supply system by the switching means to correct the power factor, said digital signal processor means being operative for predicting values of harmonic distortion defined by, for each of one or more harmonics, a harmonic impedance and a damping resistance, the processor means including means for imposing a first step change of capacitance on said system;

means for determining as a result of said first step change, values of said harmonic impedance for respective said harmonics;

means for determining from said harmonic-impedance values, values of said damping resistance for respective said harmonics;

means for determining from corresponding said harmonic-impedance and damping-resistance values, values of an electrical load parameter for respective said harmonics for a second, as yet unimposed, step change of capacitance, wherein said second step capacitance change is a desired change for the purposes of power-factor correction;

means for determining from said electrical load parameter values whether the imposition of said second step capacitance change would result in an undesirable resonance condition for the system; and, where it is determined that a resonance condition would result, means for imposing a step capacitance change other than said second step change, thereby to avoid said resonance condition.

25. The controller as claimed in claim 24, wherein the processor means chooses at least one of the correction capacitances, and wherein the switching means is operative for connecting said at least one chosen capacitance to the power supply system.

* * * * *